(12) United States Patent
Lu et al.

(10) Patent No.: US 11,164,952 B2
(45) Date of Patent: Nov. 2, 2021

(54) TRANSISTOR WITH INSULATOR

(71) Applicant: QUALCOMM Incorporated, San Diego, CA (US)

(72) Inventors: Ye Lu, San Diego, CA (US); Haining Yang, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/812,292

(22) Filed: Mar. 7, 2020

(65) Prior Publication Data

US 2021/0280684 A1    Sep. 9, 2021

(51) Int. Cl.
    *H01L 29/423*   (2006.01)
    *H01L 29/51*    (2006.01)
    *H01L 29/66*    (2006.01)
    *H01L 29/786*   (2006.01)

(52) U.S. Cl.
    CPC ...... *H01L 29/42392* (2013.01); *H01L 29/515* (2013.01); *H01L 29/66787* (2013.01); *H01L 29/78696* (2013.01)

(58) Field of Classification Search
    CPC ............. H01L 29/42392; H01L 29/515; H01L 29/66787; H01L 29/78696
    USPC ......................................................... 257/401
    See application file for complete search history.

(56) References Cited

U.S. PATENT DOCUMENTS

| 9,728,621 B1 | 8/2017 | Cheng et al. |
| 10,490,559 B1 * | 11/2019 | Ando .................. H01L 29/401 |
| 2012/0086053 A1 | 4/2012 | Tseng et al. |
| 2015/0069474 A1 | 3/2015 | Ching et al. |
| 2015/0364542 A1 | 12/2015 | Rodder et al. |
| 2017/0104060 A1 | 4/2017 | Balakrishnan et al. |
| 2018/0053690 A1 | 2/2018 | Wang et al. |
| 2018/0108732 A1 | 4/2018 | Shu et al. |
| 2018/0247938 A1 | 8/2018 | Cheng et al. |
| 2018/0337183 A1 | 11/2018 | Glass et al. |
| 2019/0096669 A1 | 3/2019 | Bi et al. |
| 2020/0020690 A1 | 1/2020 | Ando et al. |
| 2020/0058739 A1 | 2/2020 | Liaw |
| 2020/0098756 A1 | 3/2020 | Lilak et al. |

(Continued)

FOREIGN PATENT DOCUMENTS

| CN | 108172549 A | 6/2018 |
| WO | 2018200006 A1 | 11/2018 |

OTHER PUBLICATIONS

International Search Report and Written Opinion—PCT/US2021/015703—ISA/EPO—dated May 14, 2021.

*Primary Examiner* — Tong-Ho Kim

(74) *Attorney, Agent, or Firm* — Muncy, Geissler, Olds & Lowe, P.C.

(57) ABSTRACT

A gate all around transistor may be improved to provide better transistor circuits performance. In one example, a transistor circuit may include a dielectric or air gap as an insulator between the channels of the transistors in the circuit. In another example, a transistor may include a first channel surrounded by a first metal, a second channel surrounded by a second metal proximate to the first channel, and an insulator, such as a dielectric or air gap, between the first metal and the second metal. The insulator helps reduce the parasitic capacitance between the source/drain regions and the metal fill regions of the transistor.

27 Claims, 7 Drawing Sheets

(56) References Cited

U.S. PATENT DOCUMENTS

2020/0105622 A1 4/2020 Hsu et al.
2020/0135728 A1 4/2020 Liaw

* cited by examiner

TRANSISTOR WITH INSULATOR

FIELD OF DISCLOSURE

This disclosure relates generally to transistors, and more specifically, but not exclusively, to transistors with an insulator between channels.

BACKGROUND

Transistor based devices are becoming more prevalent, such as complementary metal oxide semiconductor (CMOS) transistors, fin field effect transistors (finFET), and nano-sheet (NS) gate-all-around (GAA) transistors, which is driving a need for better and smaller transistors. CMOS transistors are scaling from planar transistor to finFET, and are migrating to nano-sheet GAA devices. As manufacturing technology scales down to 5 nm nodes, the manufacturing process becomes more complex and device performance becomes difficult to further improve. GAA transistors have metal fill outside the high K/metal gate, and in some case the metal fill can be a significant area, particularly in various nano-sheet thickness schemes. The filled metal can also couple to the source and drain to induce large parasitic capacitance. This is a problem since the parasitic capacitance will significantly reduce the AC speed and impact the transistor performance.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a transistor comprises: a first channel surrounded by a first metal; a second channel proximate to and spaced from the first channel, the second channel surrounded by a second metal; a gate dielectric between the first channel and the first metal and between the second channel and the second metal; a first insulator between the first metal and the second metal; a gate on a substrate, the gate encapsulates the first metal, the second metal, and the first insulator; a source on the substrate proximate the gate; and a drain on the substrate proximate the gate.

In another aspect, a transistor comprises: a first channel surrounded by a first metal; a second channel proximate to and spaced from the first channel, the second channel surrounded by a second metal; a gate dielectric between the first channel and the first metal and between the second channel and the second metal; means for insulating between the first metal and the second metal; a gate on a substrate, the gate encapsulates the first metal, the second metal, and the means for insulating; a source on the substrate proximate the gate; and a drain on the substrate proximate the gate.

In still another aspect, a method for manufacturing a transistor comprises: providing a substrate; forming a source on the substrate; forming a drain on the substrate proximate the source; forming a first channel surrounded by a first metal proximate the substrate; forming a second channel proximate to and spaced from the first channel, the second channel surrounded by a second metal; forming a gate dielectric between the first channel and the first metal and between the second channel and the second metal; forming a first insulator between the first metal and the second metal; and forming a gate on the substrate, the gate encapsulates the first metal, the second metal, and the first insulator.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
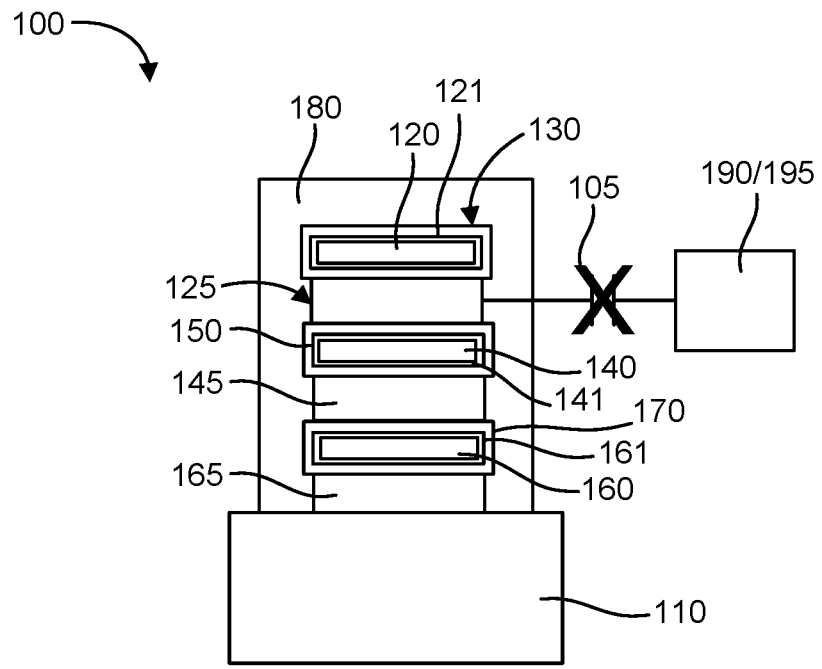
FIGS. 1A-B illustrates exemplary transistors in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Examples herein may include GAA nano-sheet (NS) FETs that have metal fill outside the high K (i.e., greater than 3.9 dielectric constant of silicon dioxide) metal gate that can couple to the source (S) and drain (D) and induce large parasitic capacitance. Examples herein significantly reduce the parasitic capacitance by creating/inserting an air gap or dielectric in the gate metal fill area between the channels. In some examples, this new structure reduces the effective metal fill area thus reducing the gate to S/D coupling parasitic capacitance by as much as >50% without a negative impact on other parts of the transistor chip or circuit and no significant additional cost to manufacture.

Figure 1B:
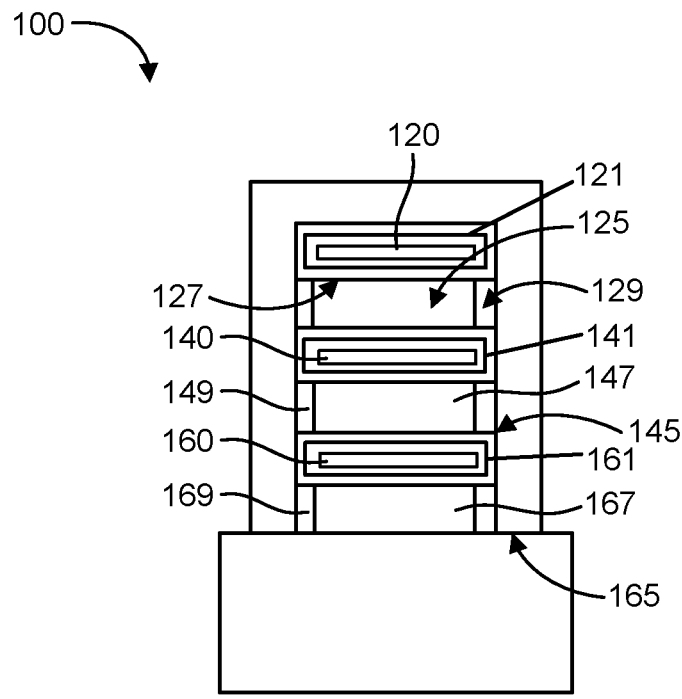

FIGS. 1A-B illustrates exemplary transistors in accordance with some examples of the disclosure. As shown in FIG. 1A, a transistor 100 (e.g., a GAA NS finFET) may comprise a substrate 110 (e.g., silicon, silicon germanium, or similar material), a first channel 120 surrounded by a first metal 130, a first gate dielectric 121 between the first channel 120 and the first metal 130, a second channel 140 surrounded by a second metal 150, a second gate dielectric 141 between the second channel 140 and the second metal 150, a third channel 160 surrounded by a third metal 170, a third gate dielectric 161 between the third channel 160 and the third metal 170, and a gate 180 on the substrate 110. The first metal 130, the second metal 150, and the third metal 170 may comprises a high K material where K is the dielectric constant of the material. A high K material, for example, includes materials with a dielectric constant greater than that of silicon dioxide, which has a K of 3.9. Thus, the first metal 130, the second metal 150, and the third metal 170 may comprises a material with a K, dielectric constant, greater than 3.9. The first gate dielectric 121, the second gate dielectric 141, and the third gate dielectric 161 may be a gate dielectric layer, which can be a high K layer, $SiO_2$ layer, SiON layer, or combination of these layers (i.e., $SiO_2$+High K). As can be seen in FIG. 1A, the transistor 100 may include a first insulator 125 between the first channel 120 and the second channel 140, a second insulator 145 between the second channel 140 and the third channel 160, and a third insulator 165 between the third channel 160 and the substrate 110. The first insulator 125, the second insulator 145, and the third insulator 165 may be a dielectric material that reduces the parasitic capacitance 105 between a respective channel and a source 190 or a drain 195 of the transistor 100 by replacing the work function metal between channels and the S/D regions of the transistor with a dielectric that impedes capacitive coupling between the regions (i.e., channel and S/D). As can be seen, the first insulator 125, the second insulator 145, and the third insulator 165 directly contact one of the first metal, 130, the second metal 150, and the third metal 170 and are located vertically between the channels (or the channel and the substrate for the third insulator 165). This space between channels (and the substrate for the third channel 160) may be partially or fully filled with a dielectric (or air gap and/or dielectric as shown in FIG. 1B) instead of the work function metal or similar material for the gate.

FIG. 1B shows an alternative. As shown in FIG. 1B, the transistor 100 may include a first insulator 125 between the first channel 120 and the second channel 140, a second insulator 145 between the second channel 140 and the third channel 160, and a third insulator 165 between the third channel 160 and the substrate 110. The first insulator 125 may comprise a first air gap 127 enclosed by a first dielectric 129. The second insulator 145 may comprise a second air gap 147 enclosed by a second dielectric 149. The third insulator 165 may comprise a third air gap 167 enclosed by a third dielectric 169. The respective air gaps and dielectric material that reduce the parasitic capacitance between a respective channel and a source or a drain of the transistor 100 by replacing the work function metal between channels and the S/D regions of the transistor with materials that impedes capacitive coupling between the regions (i.e., channel and S/D).

Figure 2A:
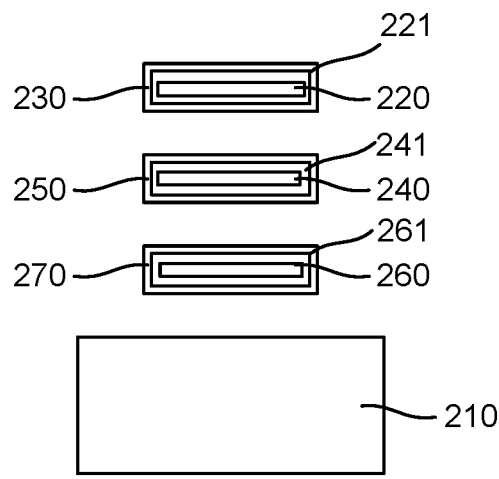
FIGS. 2A-D illustrate an exemplary partial method for manufacturing a transistor in accordance with some examples of the disclosure.
Figure 2B:
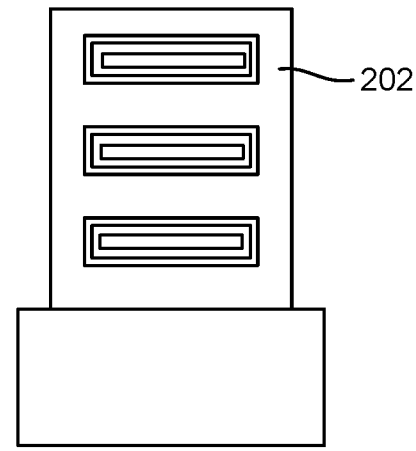
Figure 2C:
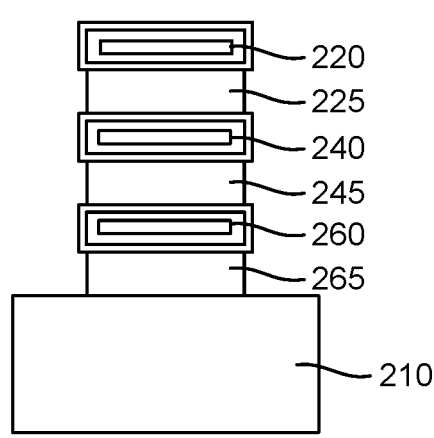
Figure 2D:
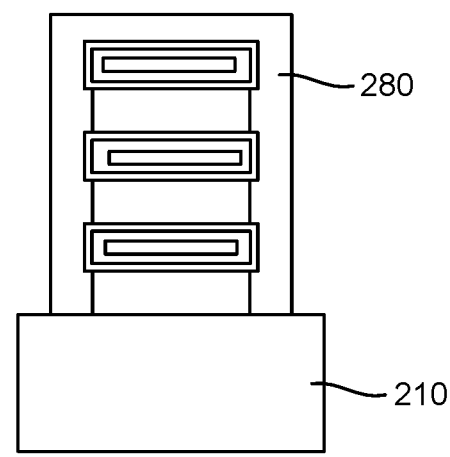

FIGS. 2A-D illustrate an exemplary partial method for manufacturing a transistor in accordance with some examples of the disclosure. As shown in FIG. 2A, the partial method may begin with a replacement metal gate (RMG) process to form a high K metal wrapped around the respective channels (e.g., ionic bonds that transport oxygen via oxygen vacancies when in contact with a deposited oxide material and subjected to a high temperature annealing process). As shown, a substrate 210 is provided and a first channel 220, a second channel 240, and a third channel 260 are formed. In addition, a high-K metal oxide (dielectric constant higher than $SiO_2$, 3.9) is formed around each channel to create a first metal 230, a second metal 250, and a third metal 270. Also, a gate dielectric is formed around each channel to create a first gate dielectric 221, a second gate dielectric 241, and a third gate dielectric 261. As shown in FIG. 2B, a dielectric material 202 is conformally grown around the current structure. Next in FIG. 2C, portions of the dielectric material 202 are removed (e.g., anisotropic etch or similar process) to form a first insulator 225 vertically between the first channel 220 and the second channel 240, a second insulator 245 vertically between the second channel 240 and the third channel 260, and a third insulator 265 vertically between the third channel 260 and the substrate 210. Lastly in FIG. 2D, a chemical vapor deposition (CVD) process is applied to grow the work function metal to form a gate 280 on the substrate 210 encapsulating the structure.

Figure 3A:
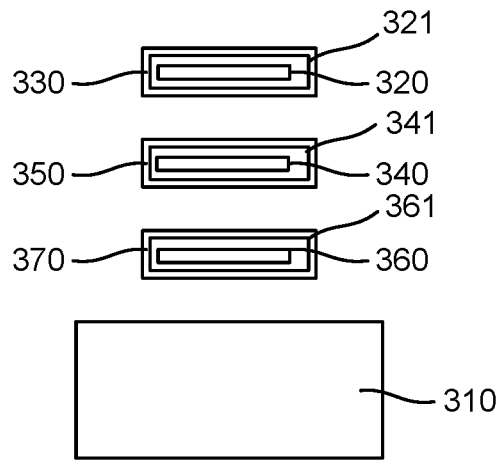
FIGS. 3A-G illustrate another exemplary partial method for manufacturing a transistor in accordance with some examples of the disclosure.
Figure 3B:
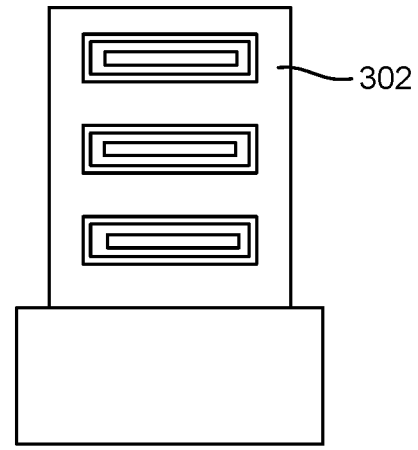
Figure 3C:
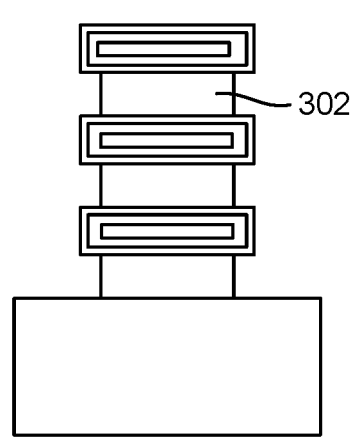
Figure 3D:
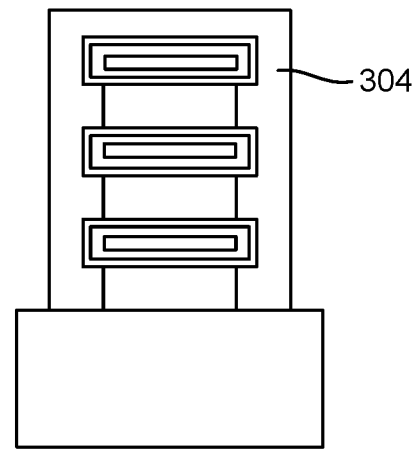
Figure 3E:
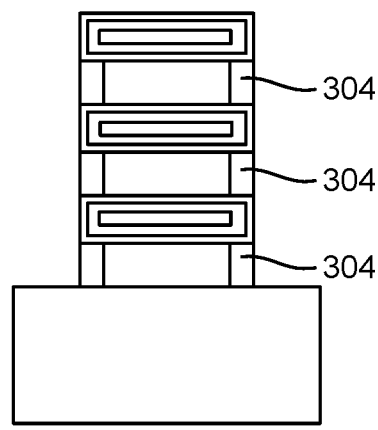
Figure 3F:
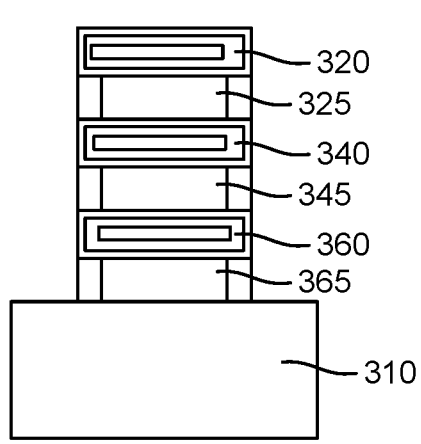
Figure 3G:
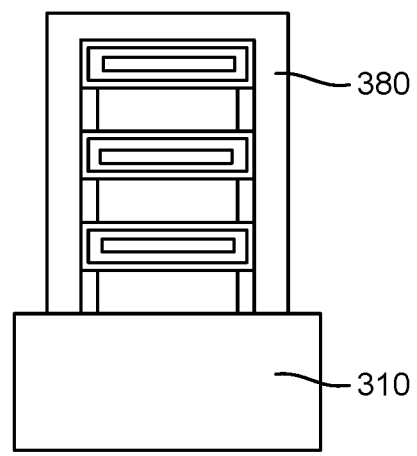

FIGS. 3A-G illustrate another exemplary partial method for manufacturing a transistor in accordance with some examples of the disclosure. As shown in FIG. 3A, the partial method may begin with a replacement metal gate (RMG) process to form a high K metal wrapped around the respective channels (e.g., ionic bonds that transport oxygen via oxygen vacancies when in contact with a deposited oxide material and subjected to a high temperature annealing process). As shown, a substrate 310 is provided and a first channel 320, a second channel 340, and a third channel 360 are formed. In addition, a high-K metal oxide (dielectric constant higher than $SiO_2$, 3.9) is formed around each channel to create a first metal 330, a second metal 350, and a third metal 370. Also, a gate dielectric is formed around each channel to create a first gate dielectric 321, a second gate dielectric 341, and a third gate dielectric 361. As shown in FIG. 3B, a sacrificial material (e.g., dielectric such as porous SiOC) 302 is conformally grown around the current structure. Next in FIG. 3C, portions of the sacrificial material 302 are removed (e.g., isotropic etch or similar process with some recess into the sacrificial material vertically below the respective channel). Next in FIG. 3D, a CVD process is applied to grow a dielectric (e.g., SiCN, SiN, etc.) 304. In FIG. 3E, portions of the dielectric material 304 are removed (e.g., anisotropic etch of the dielectric material). Next in FIG. 3F, the structure is subjected to a thermal burn of the sacrificial material 302 to form a first insulator 325 (i.e., air gap enclosed by dielectric material 304) vertically between the first channel 320 and the second channel 340, a second insulator 345 vertically between the second channel 340 and the third channel 360, and a third insulator 365 vertically between the third channel 360 and the substrate 310. Lastly in FIG. 3G, a CVD process is applied to form a gate 380 on the substrate 310 encapsulating the structure.

Figure 4:
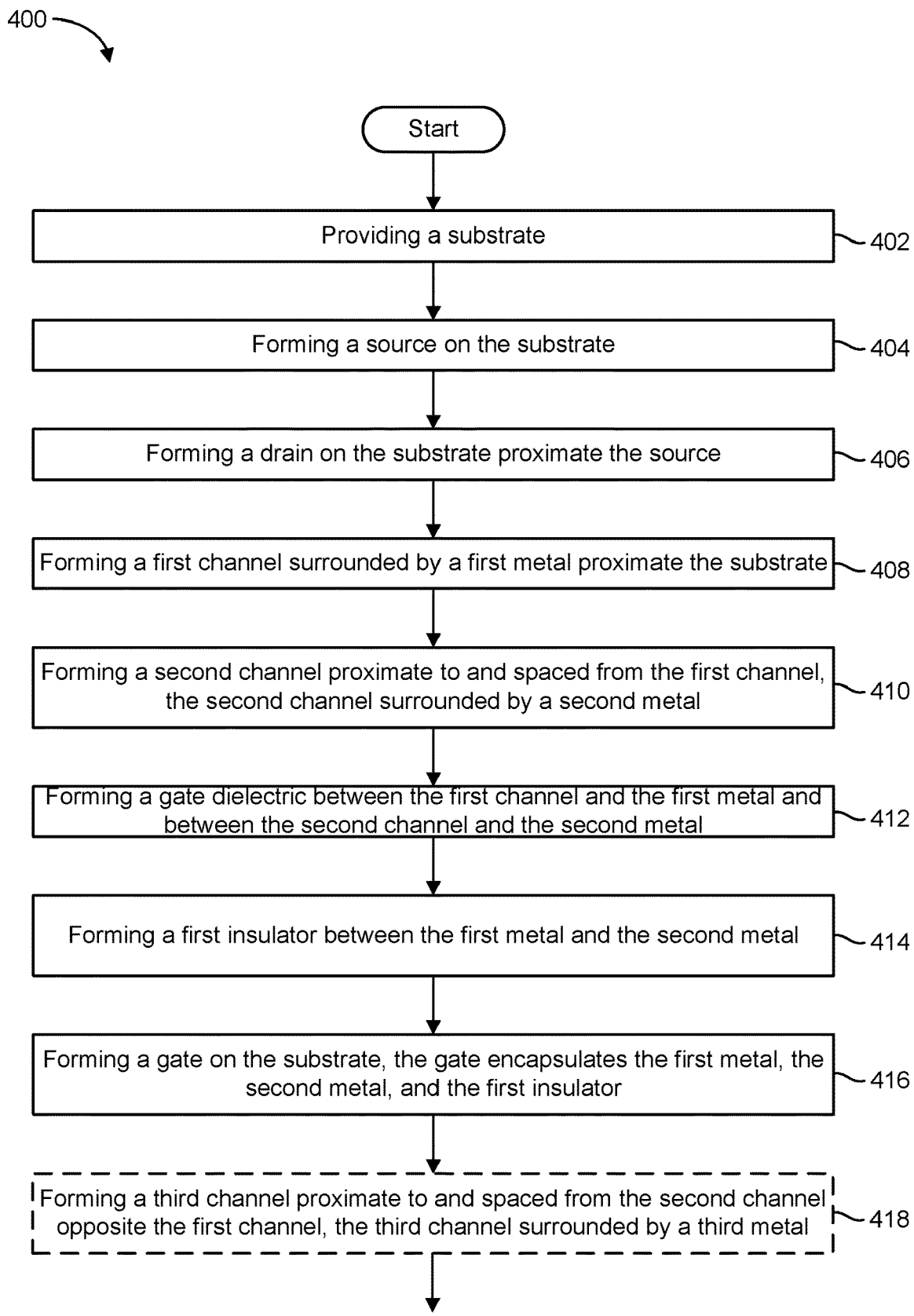
FIG. 4 illustrates an exemplary partial method in accordance with some examples of the disclosure.

FIG. 4 illustrates an exemplary partial method for manufacturing a transistor circuit in accordance with some examples of the disclosure. As shown in FIG. 4, the partial method 400 may begin in block 402 with providing a substrate. The partial method 400 may continue in block 404 with forming a source on the substrate. The partial method 400 may continue in block 406 with forming a drain on the substrate proximate the source. The partial method 400 may continue in block 408 with forming a first channel surrounded by a first metal proximate the substrate. The partial method 400 may continue in block 410 with forming a second channel proximate to and spaced from the first channel, the second channel surrounded by a second metal. The partial method 400 may continue in block 412 with forming a gate dielectric between the first channel and the first metal and between the second channel and the second metal. The partial method 400 may continue in block 414 with forming a first insulator between the first metal and the second metal. The partial method 400 may conclude in block 416 with forming a gate on the substrate, the gate encapsulates the first metal, the second metal, and the first insulator. Alternatively, the partial method 400 may continue in block 418 with forming a third channel proximate to and spaced from the second channel opposite the first channel, the third channel surrounded by a third metal; or incorporating the transistor into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 5:
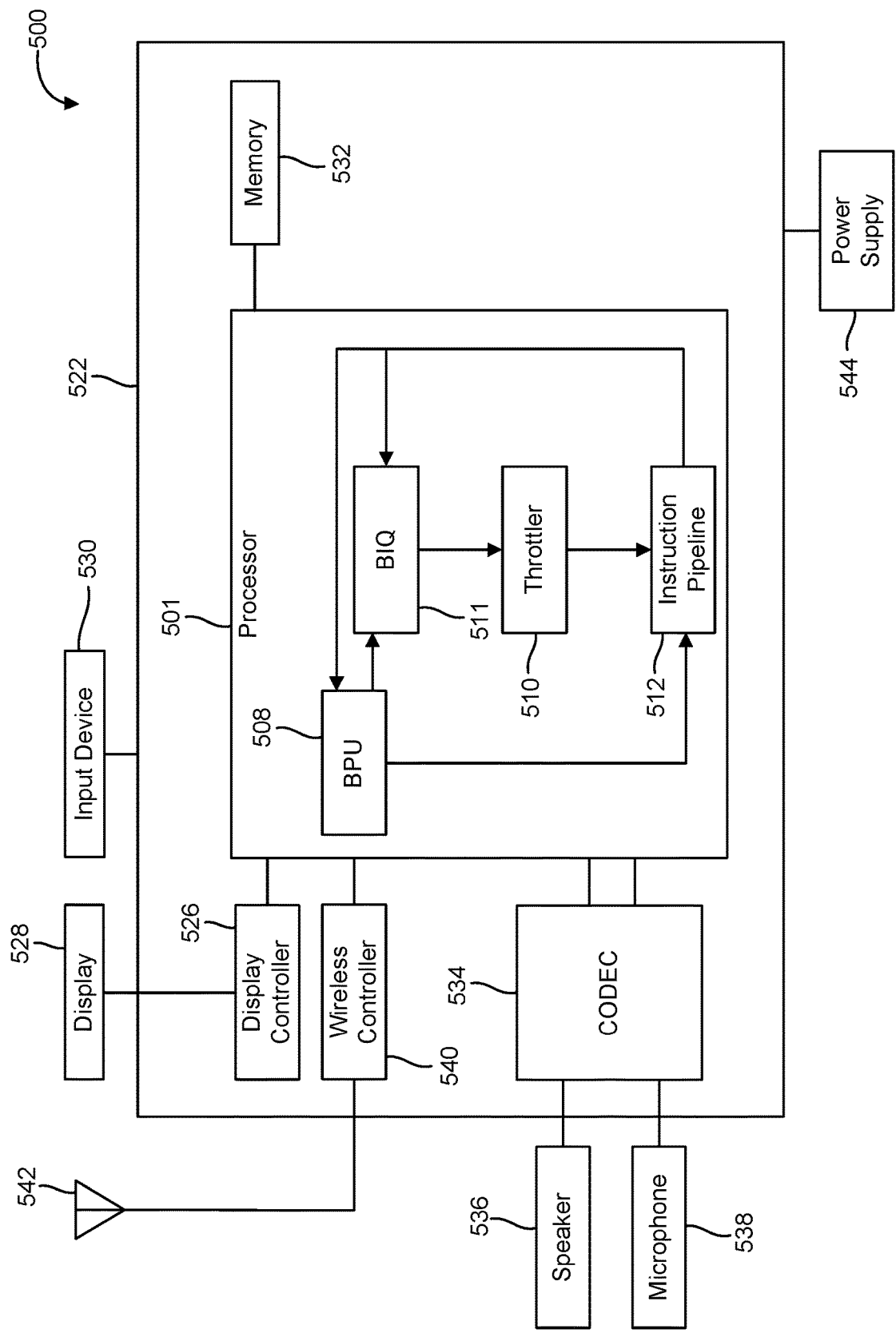
FIG. 5 illustrates an exemplary mobile device in accordance with some examples of the disclosure.

FIG. 5 illustrates an exemplary mobile device in accordance with some examples of the disclosure. Referring now to FIG. 5, a block diagram of a mobile device that is configured according to exemplary aspects is depicted and generally designated 500. In some aspects, mobile device 500 may be configured as a wireless communication device. As shown, mobile device 500 includes processor 501, which may be configured to implement the methods described herein in some aspects. Processor 501 is shown to comprise instruction pipeline 512, buffer processing unit (BPU) 508, branch instruction queue (BIQ) 511, and throttler 510 as is well known in the art. Other well-known details (e.g., counters, entries, confidence fields, weighted sum, comparator, etc.) of these blocks have been omitted from this view of processor 501 for the sake of clarity.

Processor 501 may be communicatively coupled to memory 532 over a link, which may be a die-to-die or chip-to-chip link. Mobile device 500 also include display 528 and display controller 526, with display controller 526 coupled to processor 501 and to display 528.

In some aspects, FIG. 5 may include coder/decoder (CODEC) 534 (e.g., an audio and/or voice CODEC) coupled to processor 501; speaker 536 and microphone 538 coupled to CODEC 534; and wireless controller 540 (which may include a modem) coupled to wireless antenna 542 and to processor 501.

In a particular aspect, where one or more of the above-mentioned blocks are present, processor 501, display controller 526, memory 532, CODEC 534, and wireless controller 540 can be included in a system-in-package or system-on-chip device 522. Input device 530 (e.g., physical or virtual keyboard), power supply 544 (e.g., battery), display 528, input device 530, speaker 536, microphone 538, wireless antenna 542, and power supply 544 may be external to system-on-chip device 522 and may be coupled to a component of system-on-chip device 522, such as an interface or a controller.

It should be noted that although FIG. 5 depicts a mobile device, processor 501 and memory 532 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 6:
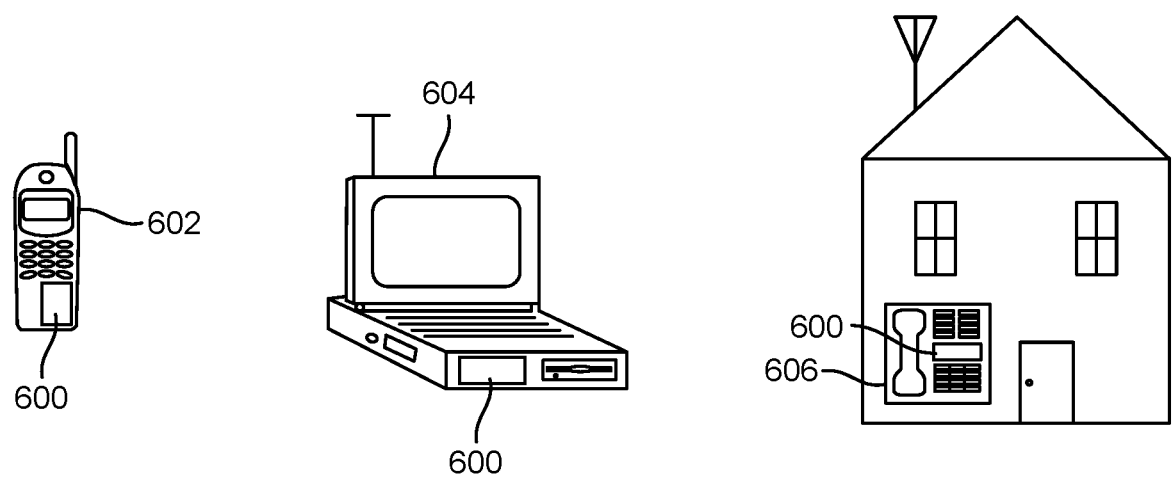
FIG. 6 illustrates various electronic devices that may be integrated with any of the aforementioned methods, devices, semiconductor devices, integrated circuits, die, interposers, packages, or package-on-packages (PoPs) in accordance with some examples of the disclosure.

FIG. 6 illustrates various electronic devices that may be integrated with any of the aforementioned integrated device, semiconductor device, integrated circuit, die, interposer, package or package-on-package (PoP) in accordance with some examples of the disclosure. For example, a mobile phone device 602, a laptop computer device 604, and a fixed location terminal device 606 may include an integrated device 600 as described herein. The integrated device 600 may be, for example, any of the integrated circuits, dies, integrated devices, integrated device packages, integrated circuit devices, device packages, integrated circuit (IC) packages, package-on-package devices described herein. The devices 602, 604, 606 illustrated in FIG. 6 are merely exemplary. Other electronic devices may also feature the integrated device 600 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, a transistor may comprises: a first channel surrounded by a first metal; a second channel proximate to and spaced from the first channel, the second channel surrounded by a second metal; means for insulating (e.g., first insulator) between the first metal and the second metal; a gate on a substrate, the gate encapsulates the first metal, the second metal, and the means for insulating; a source on the substrate proximate the gate; and a drain on the substrate proximate the gate. In some examples, the transistor is a gate all around field effect transistor, the means for insulating is a dielectric, the means for insulating is an air gap, the means for insulating is an air gap enclosed by a dielectric, the transistor further comprises a third channel proximate and spaced from the second channel opposite the first channel, the third channel surrounded by a third metal, the first metal comprises a dielectric material with a dielectric constant greater than 3.9, the substrate comprises a shallow trench isolation region, and the transistor is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

It will be appreciated that the aforementioned aspects are merely provided as examples and the various aspects claimed are not limited to the specific references and/or illustrations cited as examples.

One or more of the components, processes, features, and/or functions illustrated in FIGS. 1A-6 may be rearranged and/or combined into a single component, process, feature or function or incorporated in several components, processes, or functions. Additional elements, components, processes, and/or functions may also be added without departing from the disclosure. It should also be noted that FIGS. 1A-6 and its corresponding description in the present disclosure is not limited to dies and/or ICs. In some implementations, FIGS. 1A-6 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A transistor comprising:
  a first channel surrounded by a first metal;
  a second channel proximate to and spaced from the first channel, the second channel surrounded by a second metal;
  a gate dielectric between the first channel and the first metal and between the second channel and the second metal;
  a first insulator between the first metal and the second metal, wherein the first insulator is an air gap enclosed by a dielectric;
  a gate on a substrate, the gate encapsulates the first metal, the second metal, and the first insulator;
  a source on the substrate proximate the gate; and
  a drain on the substrate proximate the gate.

2. The transistor of claim 1, wherein the transistor is a gate all around field effect transistor.

3. The transistor of claim 1, wherein the dielectric of the first insulator is at least one of Silicon Carbonitride (SiCN) or Silicon Nitride (SiN).

4. The transistor of claim 1, wherein the air gap of the first insulator has a cross-section having a horizontal axis that is longer than a vertical axis.

5. The transistor of claim 4, wherein the cross-section of the air gap has a generally rectangular shape.

6. The transistor of claim 1, further comprising a third channel proximate and spaced from the second channel opposite the first channel, the third channel surrounded by a third metal.

7. The transistor of claim 6, further comprising:
  a second insulator between the second metal and the third metal, wherein the second insulator is a second air gap enclosed by a second dielectric.

8. The transistor of claim 1, wherein the first metal comprises a dielectric material with a dielectric constant greater than 3.9.

9. The transistor of claim 1, wherein the substrate comprises a shallow trench isolation region.

10. The transistor of claim 1, wherein the transistor is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

11. A transistor comprising:
  a first channel surrounded by a first metal;
  a second channel proximate to and spaced from the first channel, the second channel surrounded by a second metal;
  a gate dielectric between the first channel and the first metal and between the second channel and the second metal;
  means for insulating between the first metal and the second metal, wherein the means for insulating is an air gap enclosed by a dielectric;
  a gate on a substrate, the gate encapsulates the first metal, the second metal, and the means for insulating;
  a source on the substrate proximate the gate; and
  a drain on the substrate proximate the gate.

12. The transistor of claim 11, wherein the transistor is a gate all around field effect transistor.

13. The transistor of claim 11, wherein the dielectric of the means for insulating is at least one of Silicon Carbonitride (SiCN) or Silicon Nitride (SiN).

14. The transistor of claim 11, wherein the air gap of the means for insulating has a cross-section having a horizontal axis that is longer than a vertical axis.

15. The transistor of claim 14, wherein the cross-section of the air gap has a generally rectangular shape.

16. The transistor of claim 11, further comprising a third channel proximate and spaced from the second channel opposite the first channel, the third channel surrounded by a third metal.

17. The transistor of claim 16, further comprising:
  a second means for insulating between the second metal and the third metal, wherein the second means for insulating is a second air gap enclosed by a second dielectric.

18. The transistor of claim 11, wherein the first metal comprises a dielectric material with a dielectric constant greater than 3.9.

19. The transistor of claim 11, wherein the substrate comprises a shallow trench isolation region.

20. The transistor of claim 11, wherein the transistor is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method for manufacturing a transistor, the comprising:
providing a substrate;
forming a source on the substrate;
forming a drain on the substrate proximate the source;
forming a first channel surrounded by a first metal proximate the substrate;
forming a second channel proximate to and spaced from the first channel, the second channel surrounded by a second metal;
forming a gate dielectric between the first channel and the first metal and between the second channel and the second metal;
forming a first insulator between the first metal and the second metal, wherein the first insulator is an air gap enclosed by a dielectric; and
forming a gate on the substrate, the gate encapsulates the first metal, the second metal, and the first insulator.

22. The method of claim 21, wherein the transistor is a gate all around field effect transistor.

23. The method of claim 21, wherein the dielectric of the first insulator is at least one of Silicon Carbonitride (SiCN) or Silicon Nitride (SiN).

24. The method of claim 21, wherein the method further comprises forming a third channel proximate to and spaced from the second channel opposite the first channel, the third channel surrounded by a third metal.

25. The method of claim 21, wherein the first metal comprises a dielectric material with a dielectric constant greater than 3.9.

26. The method of claim 21, wherein the substrate comprises a shallow trench isolation region.

27. The method of claim 21, wherein the method further comprises incorporating the transistor into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *